(12) United States Patent
Zeng et al.

(10) Patent No.: US 7,525,350 B2
(45) Date of Patent: Apr. 28, 2009

(54) ZERO-WAITING-CURRENT PRECISE OVER-VOLTAGE COMPARATOR

(75) Inventors: Ni Zeng, Shenzhen (CN); Gangqiang Zhang, Shenzhen (CN)

(73) Assignee: Shenzhen STS Microelectronics Co., Ltd. (CN)

( * ) Notice: Subject to any disclaimer, the term of this patent is extended or adjusted under 35 U.S.C. 154(b) by 63 days.

(21) Appl. No.: 11/831,769

(22) Filed: Jul. 31, 2007

(65) Prior Publication Data

US 2008/0061844 A1   Mar. 13, 2008

(30) Foreign Application Priority Data

Sep. 8, 2006   (CN) .................... 2006 1 0153719

(51) Int. Cl.
*H02H 9/04* (2006.01)

(52) U.S. Cl. .................... 327/78; 327/88; 327/89; 361/91.1; 361/91.5

(58) Field of Classification Search ............. 327/77–81, 327/83, 85, 87–89; 361/91.1, 91.5
See application file for complete search history.

(56) References Cited

U.S. PATENT DOCUMENTS

| | | | | |
|---|---|---|---|---|
| 6,486,727 | B1 * | 11/2002 | Kwong | 327/534 |
| 6,924,533 | B2 * | 8/2005 | Takemura et al. | 257/355 |
| 7,224,192 | B2 * | 5/2007 | Fukushi et al. | 327/77 |

\* cited by examiner

*Primary Examiner*—Donovan Lincoln
*Assistant Examiner*—Patrick O'Neill
(74) *Attorney, Agent, or Firm*—Lisa K. Jorgenson; William J. Kubida

(57) ABSTRACT

A precise over-voltage comparator exhibits zero-waiting-current characteristics during normal working conditions. An NMOS transistor is used in conjunction with other circuit elements to regulate the over-voltage comparator. For normal power supply voltages, the comparator stays in standby status and does not consume quiescent current.

21 Claims, 3 Drawing Sheets

ZERO-WAITING-CURRENT PRECISE OVER-VOLTAGE COMPARATOR

RELATED APPLICATION

The present application claims priority of Chinese Application No. 200610153719.4 filed Sep. 8, 2006, which is incorporated herein in its entirety by this reference.

BACKGROUND OF THE INVENTION

The present invention is related to over-voltage comparators and more particularly to an over-voltage comparator circuit that includes a particular power-savings feature during normal voltage operating conditions.

The following symbol conventions are used to describe the prior art as well as the present invention, and are listed below in Table 1.

TABLE 1

| | Symbols Conventions |
|---|---|
| VS | power supply voltage to be detected. |
| 5 V | on-chip internal 5 V supply. |
| $V_{drop}$ | voltage drop of a series of zener diodes and bipolar transistors. It has low temperature coefficient. |
| $V_{BG}$ | voltage of on-chip bandgap reference, around 1.24 V. |
| $VS_{threshold}$ | threshold voltage of over-voltage comparator. It is much higher than normal operation voltage. |
| $I_b$ | bias current. |
| $I_p$ | pull current. |

In general, there are two traditional circuit structures that are used for over-voltage comparators. The first traditional comparator structure 100 is shown in FIG. 1. Comparator 100 includes $V_{drop}$ circuit 102 coupled to the VS power supply voltage source, a resistor divider 106 including resistors R1 and R2 coupled between $V_{drop}$ circuit 102 and ground. An NMOS transistor M1 has a gate coupled to resistor divider 106, a drain for receiving the bias current $I_b$, and a source coupled to ground. The bias current $I_b$ is coupled between the internal five volt power supply voltage source and the drain of transistor M1. A Schmitt trigger circuit 104 has an input coupled to the drain of transistor M1 and an output for providing the OUT over-voltage output signal.

The comparator circuit 100 takes the threshold voltage of NMOS transistor M1 as a reference voltage. The threshold voltage is given by the following equation:

$$VS_{threshold} = V_{GS(M1)} * \frac{R_2 + R_1}{R_2} + V_{drop} \qquad [1]$$

The bias current is given by the following equation:

$$I_b = \frac{1}{2} \mu_n C_{ox} (V_{GS(M1)} - V_{th(M1)})^2 \qquad [2]$$

The transition threshold of circuit 100 can be derived from equations [1] and [2] as follows:

$$VS_{threshold} = \left[ \sqrt{\frac{2}{\mu_n C_{ox}} * I_b} + V_{th(M1)} \right] * \frac{R_1 + R_2}{R_2} + V_{drop} \qquad [3]$$

It can be seen that the threshold of comparator circuit 100 varies with the threshold voltage $V_{th}$ of NMOS transistor M1, which changes with semiconductor process and temperature. It can also be that the threshold of comparator circuit 100 varies with the accuracy of bias current $I_b$.

The second traditional over-voltage comparator circuit 200 is shown in FIG. 2. Comparator circuit 200 similarly includes $V_{drop}$ circuit 202 and resistor divider 206 as previously described. Additionally, comparator circuit 200 includes a current mirror circuit 208 having a power terminal coupled to the internal five volt power supply voltage, an input for receiving the $I_b$ bias current, and an output for supplying the $I_{in}$ current to comparator 210. Comparator 210 includes a first input coupled to the output of resistor divider 206, a second input for receiving an on-chip bandgap reference voltage $V_{BG}$. The output of comparator 210 is coupled to the input of Schmitt trigger circuit 204. The output of Schmitt trigger circuit 204 provides the output OUT signal indication of an over-voltage condition.

The threshold voltage of circuit 200 is given by the following equation:

$$VS_{threshold} = V_{BG} * \frac{R_1 + R_2}{R_2} + V_{drop} \qquad [4]$$

The threshold of comparator circuit 200 has better precision than the first solution because it only concerns with $V_{BG}$, the matching of R1 and R2, and $V_{drop}$. The drawback is that its quiescent current is not zero even if VS is in normal working, as demonstrated in the equation below:

$$I_{quiescent} = I_{in} + I_b \qquad [5]$$

In low quiescent current chip designs, this non-zero current has to be taken into consideration.

What is desired, therefore, is an over-voltage comparator circuit that has a precision threshold, yet does not draw any appreciable quiescent current during normal operation conditions.

SUMMARY OF THE INVENTION

An over-voltage comparator circuit includes a power supply voltage to be monitored, a voltage-dropping circuit coupled to the supply voltage, a resistor divider coupled between the voltage-dropping circuit and ground, a transistor coupled to a first output of the resistor divider, a comparator coupled to a second output of the resistor divider having an output for providing an over-voltage indication, and a current mirror having an input coupled to the transistor and an output coupled to the comparator. Using this design, the transistor and comparator consume no quiescent current during normal voltage operating conditions.

BRIEF DESCRIPTION OF THE DRAWINGS

The above and other features and advantages of the invention will be more readily understood from the following detailed description of the invention which is provided in connection with the accompanying drawings, in which.

DETAILED DESCRIPTION OF THE INVENTION

Figure 1:
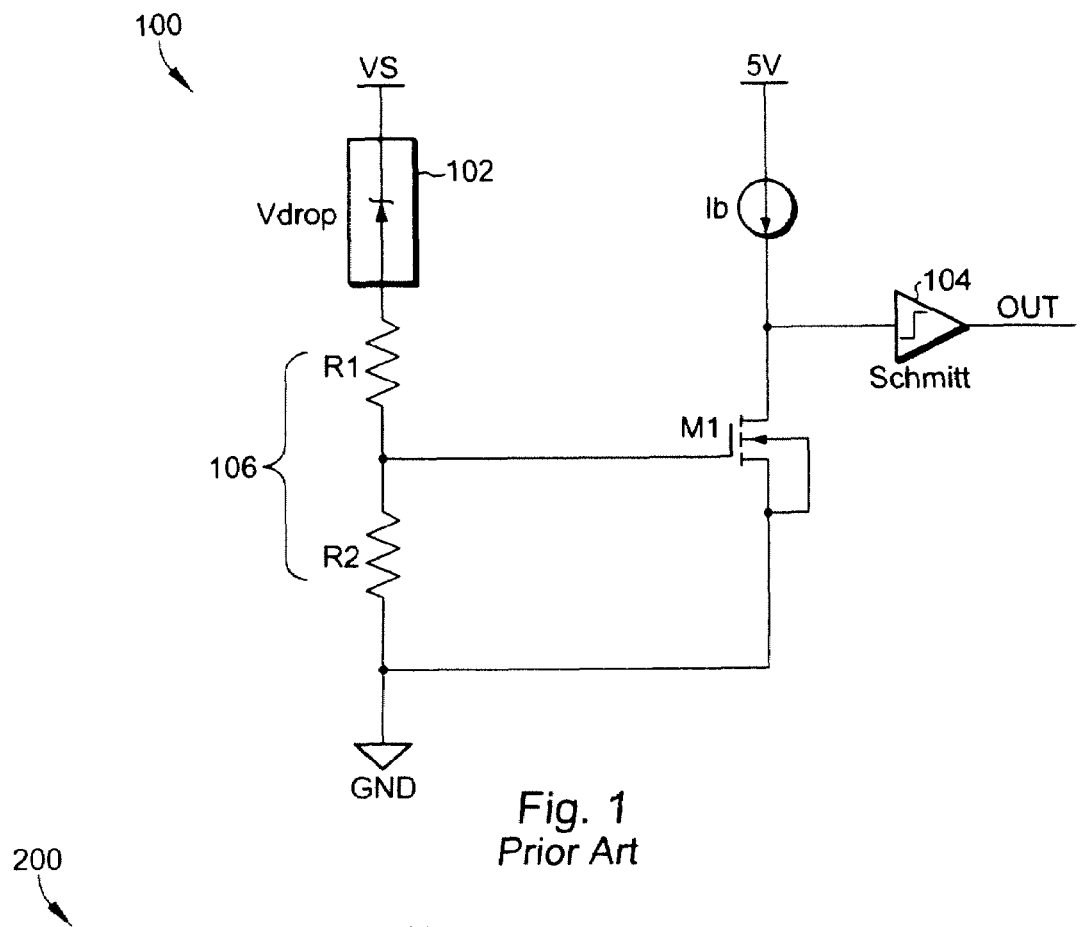
FIG. 1 is a schematic diagram of a first over-voltage comparator circuit according to the prior art.
Figure 2:
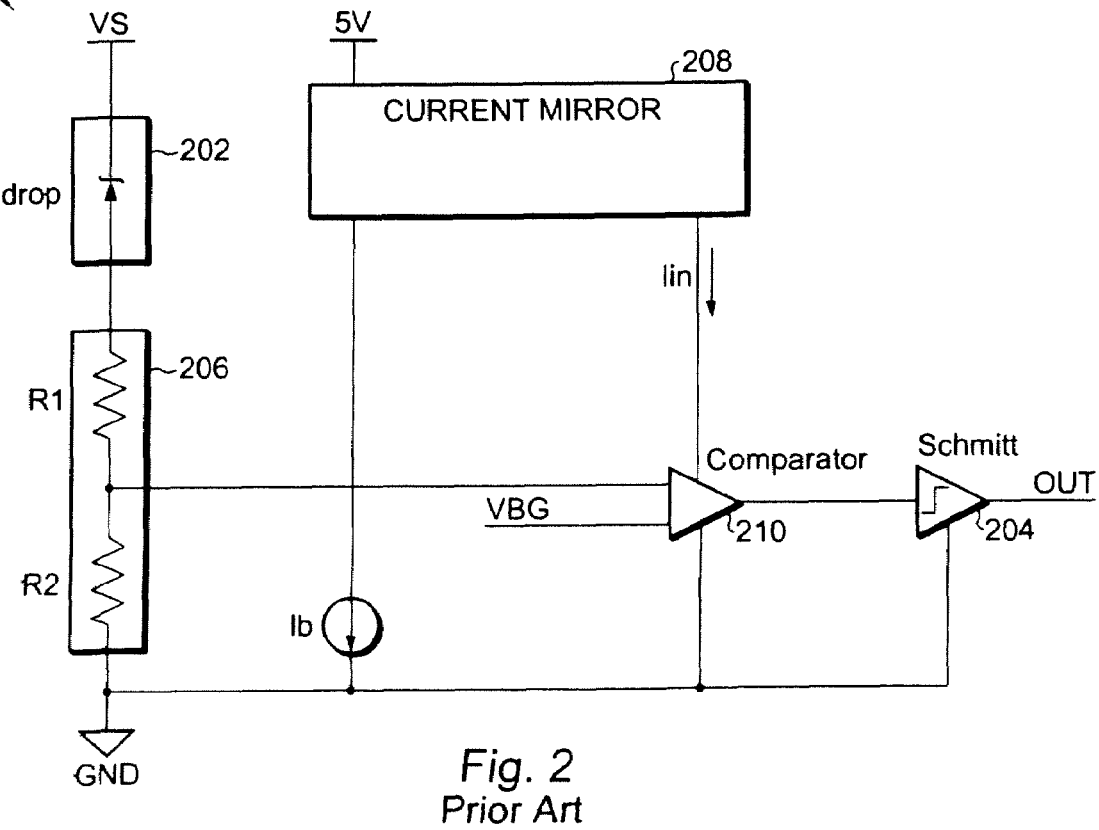
FIG. 2 is a schematic diagram of a second over-voltage comparator circuit according to the prior art.
Figure 3:
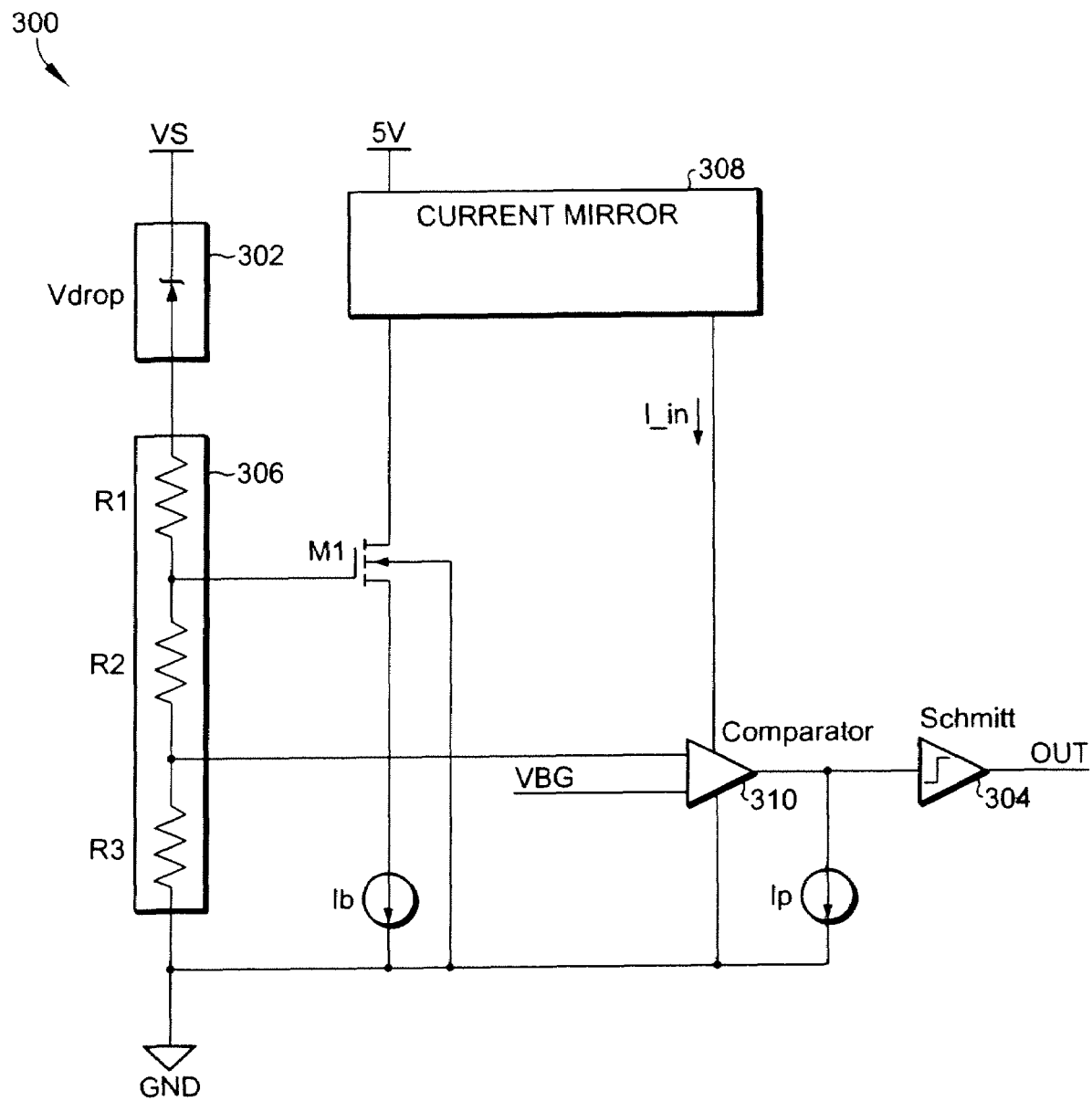
FIG. 3 is a schematic diagram of an over-voltage comparator circuit according to the present invention.

The over-voltage comparator circuit 300 of the present invention is presented in FIG. 3. Comparator circuit 300 includes a $V_{drop}$ circuit 302 coupled to VS and a two-output resistor divider 306 coupled between the $V_{drop}$ circuit 302 and ground. Resistor divider 306 includes serially coupled resistors R1, R2, and R3. An NMOS transistor M1 has a gate coupled to a first output of resistor divider 306, at the junction of resistors R1 and R2. The source of transistor M1 is biased by bias current $I_b$. The drain of transistor M1 is coupled to the input of current mirror 308. Current mirror 308 has a power terminal coupled to the internal five volt power supply voltage, and an output for providing the current labeled Iin in FIG. 3. Current mirror circuit 308 can be designed with PMOS transistors as is known in the art and can include a simple current mirror, Wilson current mirror, or other known current mirror circuits. Comparator 310 has a first input coupled to a second output of resistor divider 306. The second output is formed at the junction of resistors R2 and R3. A second input of comparator 310 receives an internally generated $V_{BG}$ bandgap voltage. A first power terminal of comparator 310 receives the Iin current from current mirror circuit 308, and a second power terminal of comparator 310 is coupled to ground. An output pull-down current $I_p$ is coupled from the output of comparator 310 to ground. $I_p$ is a small pull-down current source. It pulls the output of the comparator 310 down to be zero when the comparator 310 is not active. The pull-down current does not affect the comparator 310 function when the comparator is active. A Schmitt trigger circuit 304 has an input coupled to the output of comparator 310 for providing the output signal indicating an over-voltage condition.

When VS is within a normal voltage range, transistor M1 is not conducting. Therefore, no current is drawn from internal five volt supply. When:

$$VS > VS_{on} = V_{th(M1)} * \frac{R_1 + R_2 + R_3}{R_2 + R_3} + V_{drop} \quad [6]$$

transistor M1 conducts and acts as a switch, which provides the current necessary so that comparator 310 is active and prepared to switch. The threshold for providing an over-voltage indication is given by:

$$VS_{threshold} = V_{BG} * \frac{R_1 + R_2 + R_3}{R_3} + V_{drop} \quad [7]$$

Because the $VS_{threshold}$ is designed to be greater than $VS_{on}$, comparator 310 is active and well prepared to switch before the $VS=VS_{threshold}$.

The over-voltage comparator circuit 310 of the present invention includes the merits of the two traditional over-voltage comparators described above. Comparator circuit 310 saves quiescent current over a normal working range and detects an over-voltage condition using an accurate over-voltage threshold. In part, the design of the comparator circuit of the present invention includes an NMOS transistor in conjunction with other circuit elements to regulate a comparator. Under normal power supply voltages, the comparator stays in standby status and does not consume any quiescent current.

Figure 4:
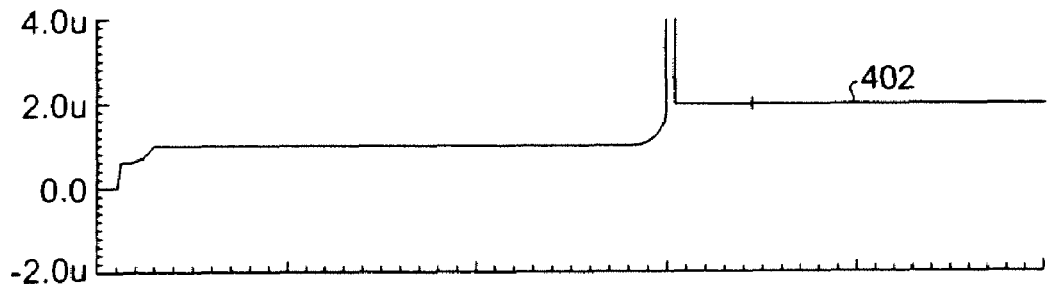
FIG. 4 is a timing diagram that compares the quiescent currents of the first over-voltage comparator circuit, the second over-voltage comparator circuit, and the over-voltage comparator circuit of the present invention.
Figure 4:
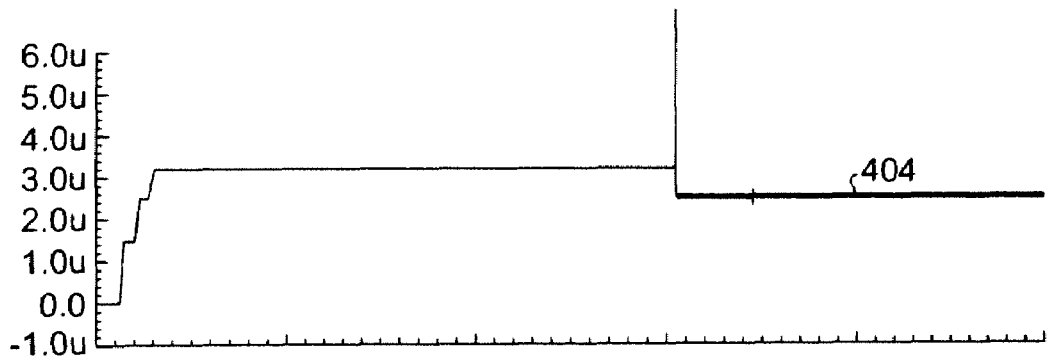
Figure 4:
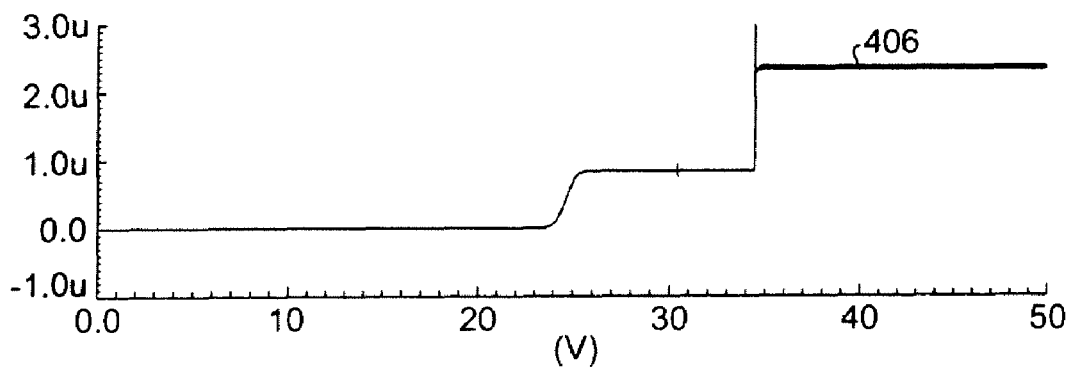

Simulation results 400 are shown in FIG. 4. The following conditions were used in the simulation:

1) The threshold voltage of over-voltage comparator circuit is specified to be 30 volts. Normal working range for voltage VS is between 9 volts and 16 volts.
2) The $V_{drop}$ circuit is a series of four zener diodes and three diode-connected NPN bipolar transistors.
3) A bandgap circuit is added to the simulation circuit to generate the reference $V_{BG}$ and the current sources.
4) All the simulations are done using the same semiconductor process.

The simulation results using a nominal typical semiconductor process for the three over-voltage comparator circuits (first and second prior art circuits and the over-voltage comparator circuit of the present invention) are shown in Table 2.

TABLE 2

| | | Simulation Results | | |
|---|---|---|---|---|
| Temperature (° C.) | Process Bias | Proposed Comparator (V) | Traditional Comparator 2 (V) | Traditional Comparator 1 (V) |
| 27 | TYP | 30.0 | 30.0 | 30.0 |
| −40 | TYP | 30.0 | 30.0 | 31.0 |
| 150 | TYP | 30.1 | 30.1 | 28.0 |

The simulation results for the three over-voltage comparator circuits are as follows:

1) For the first traditional comparator circuit, maximum $VS_{threshold}$ is 33.9V and minimal $VS_{threshold}$ is 24.4V.
2) For the second traditional comparator circuit, maximum $VS_{threshold}$ is 31.4V and minimal $VS_{threshold}$ is 28.7V.
3) For the comparator circuit of the present invention, the result is the same as with the second traditional comparator circuit.

FIG. 4 shows the first comparator circuit quiescent current 402, the second comparator circuit quiescent current 404, and present invention comparator circuit quiescent current 406. The Y coordinate indicates the current drawn from 5V supply and the X coordinate indicates the value of VS. Note that current 402 is initially about one microamp, current 404 is about three microamps, and current 406 is effectively zero before transistor M1 switches and before the over-voltage indication is provided. From above results, it can be seen that the over-voltage circuit of the present invention saves quiescent current over the normal working range, yet still provides an accurate over-voltage indication.

Although the present invention has been described with reference to a preferred embodiment thereof, it will be understood that the invention is not limited to the details thereof. Various substitutions and modifications have been suggested in the foregoing description, and other will occur to those of ordinary skill in the art. Therefore, all such substitutions and modifications are intended to be embraced within the scope of the invention as defined in the appended claims.

We claim:

1. An over-voltage comparator circuit comprising:
   a first power supply voltage;
   a voltage-dropping circuit coupled to the first power supply voltage;
   a resistor divider coupled between the voltage-dropping circuit and ground;
   a transistor coupled to a first output of the resistor divider;
   a current mirror coupled to a second power supply voltage and to the transistor; and
   a comparator coupled to the current mirror and a second output of the resistor divider having an output for providing an over-voltage indication.

2. The over-voltage comparator circuit of claim 1 wherein the first power supply voltage comprises the power supply voltage to be detected.

3. The over-voltage comparator circuit of claim 1 wherein the voltage-dropping circuit comprises a series of four zener diodes and three diode-connected NPN bipolar transistors.

4. The over-voltage comparator circuit of claim 1 wherein the resistor divider comprises first, second, and third resistors coupled in series, and wherein a junction of the first and second resistors comprises the first output of the resistor divider, and wherein a junction of the second and third resistors comprises the second output of the resistor divider.

5. The over-voltage comparator circuit of claim 1 wherein the transistor comprises an NMOS transistor.

6. The over-voltage comparator circuit of claim 1 wherein the transistor comprises a gate coupled to the first input of the resistor divider, a first source/drain coupled to the current mirror, and a second source/drain for receiving a bias current.

7. The over-voltage comparator circuit of claim 1 wherein, when the first power supply voltage is within a normal working range, the transistor is not conducting and not drawing any current from the second power supply voltage.

8. The over-voltage comparator circuit of claim 1 wherein the second power supply voltage comprises an on-chip internal five-volt supply voltage.

9. The over-voltage comparator circuit of claim 1 wherein the comparator comprises a first input coupled to the second output of the resistor divider and a second input for receiving a bandgap voltage.

10. The over-voltage comparator circuit of claim 1 comprising a first switching threshold for the transistor, and a second switching threshold for the comparator.

11. The over-voltage comparator circuit of claim 1 wherein the transistor conducts when the following equation is satisfied, wherein VS is the first power supply voltage, Vth(M1) is the threshold voltage of the transistor, R1 is a first resistor in the resistor divider, R2 is a second resistor in the resistor divider, R3 is a third resistor in the resistor divider, and $V_{drop}$ is the voltage drop of the voltage-dropping circuit:

$$VS > VS_{on} = V_{th(M1)} * \frac{R_1 + R_2 + R_3}{R_2 + R_3} + V_{drop}.$$

12. The over-voltage comparator circuit of claim 1 wherein the switching threshold of the comparator is given by the following equation, wherein VBG is a bandgap voltage, R1 is a first resistor in the resistor divider, R2 is a second resistor in the resistor divider, R3 is a third resistor in the resistor divider, and $V_{drop}$ is the voltage drop of the voltage-dropping circuit:

$$VS_{threshold} = V_{BG} * \frac{R_1 + R_2 + R_3}{R_3} + V_{drop}.$$

13. The over-voltage comparator circuit of claim 1 further comprising a pull-down current source coupled to the output of the comparator.

14. The over-voltage comparator circuit of claim 1 further comprising a Schmitt trigger circuit coupled to the output of the comparator.

15. The over-voltage comparator circuit of claim 1 wherein the nominal threshold voltage of the comparator is set when the first power supply voltage reaches thirty volts.

16. The over-voltage comparator circuit of claim 1 wherein the maximum threshold voltage of the comparator is set when the first power supply voltage reaches 31.4 volts.

17. The over-voltage comparator circuit of claim 1 wherein the minimum threshold voltage of the comparator is set when the first power supply voltage reaches 28.7 volts.

18. The over-voltage comparator circuit of claim 1 wherein a normal working range for the first power supply voltage is between nine and sixteen volts.

19. An over-voltage comparator circuit comprising:
   a power supply voltage to be monitored;
   a voltage-dropping circuit coupled to the supply voltage;
   a resistor divider coupled between the voltage-dropping circuit and ground;
   a transistor coupled to a first output of the resistor divider;
   a comparator coupled to a second output of the resistor divider having an output for providing an over-voltage indication; and
   a current mirror having an input coupled to the transistor and an output coupled to the comparator.

20. The over-voltage comparator circuit of claim 1 wherein the transistor and comparator consume no quiescent current during normal voltage operating conditions.

21. An over-voltage comparator circuit comprising:
   a transistor having a first switching threshold;
   a comparator having a second switching threshold; and
   a current mirror for coupling the transistor to the comparator, wherein the transistor and the comparator do not consume quiescent current during normal working conditions, and only consume quiescent current during an over-voltage condition.

* * * * *